United States Patent
Keidar et al.

(10) Patent No.: US 9,839,896 B2
(45) Date of Patent: Dec. 12, 2017

(54) SYSTEM AND METHOD FOR MASS PRODUCTION OF GRAPHENE PLATELETS IN ARC PLASMA

(71) Applicant: The George Washington University, Washington, DC (US)

(72) Inventors: Michael Keidar, Baltimore, MD (US); Alexey Shashurin, Rockville, MD (US)

(73) Assignee: The George Washington University, Washington, DC (US)

( * ) Notice: Subject to any disclaimer, the term of this patent is extended or adjusted under 35 U.S.C. 154(b) by 217 days.

(21) Appl. No.: 14/547,747

(22) Filed: Nov. 19, 2014

(65) Prior Publication Data

US 2016/0038907 A1 Feb. 11, 2016

Related U.S. Application Data

(63) Continuation-in-part of application No. 13/910,699, filed on Jun. 5, 2013, now abandoned.

(60) Provisional application No. 61/658,665, filed on Jun. 12, 2012.

(51) Int. Cl.
| | |
|---|---|
| *B01J 19/08* | (2006.01) |
| *B82Y 30/00* | (2011.01) |
| *B82Y 40/00* | (2011.01) |
| *H01J 37/32* | (2006.01) |
| *C01B 31/04* | (2006.01) |

(52) U.S. Cl.
CPC .......... *B01J 19/088* (2013.01); *B01J 19/08* (2013.01); *B82Y 30/00* (2013.01); *B82Y 40/00* (2013.01); *C01B 31/0446* (2013.01); *C01B 31/0453* (2013.01); *H01J 37/32614* (2013.01); *B01J 2219/083* (2013.01); *B01J 2219/0809* (2013.01); *B01J 2219/0822* (2013.01); *B01J 2219/0839* (2013.01); *B01J 2219/0875* (2013.01); *H01J 2329/0444* (2013.01)

(58) Field of Classification Search
CPC .. B01J 2219/0839; B01J 19/088; B01J 19/08; B01J 2219/0809; B01J 2219/083; B01J 2219/0875; H01J 2201/30469; H01J 2201/30461; H01J 2329/0444; H01J 2329/0455; H01J 37/32614; C01B 31/0446; C01B 31/0453; B82Y 30/00; B82Y 40/00
See application file for complete search history.

(56) References Cited

U.S. PATENT DOCUMENTS

| | | | | |
|---|---|---|---|---|
| 6,827,823 B2* | 12/2004 | Takikawa | ............... | B01J 19/088 204/173 |
| 7,306,503 B2* | 12/2007 | Saito | ..................... | B01J 19/088 427/475 |
| 2007/0092431 A1* | 4/2007 | Resasco | ................ | B01J 23/882 423/447.3 |

OTHER PUBLICATIONS

J. Li et al., "Simultaneous Synthesis of Single-Walled Carbon Nanotubes and Graphene in a Magnetically-Enhanced Arc Plasma," Journal of Visualized Exrperiments, Feb. 2012, pp. 1-6.

(Continued)

*Primary Examiner* — Michael Band
(74) *Attorney, Agent, or Firm* — Blank Rome LLP (57) ABSTRACT

A system and method for producing graphene includes a discharge assembly and a substrate assembly. The discharge assembly includes a cathode and an anode, which in one embodiment are offset from each other. The anode produces a flux stream that is deposited onto a substrate. A collection device removes the deposited material from the rotating substrate. The flux stream can be a carbon vapor, with the deposited flux being graphene.

17 Claims, 11 Drawing Sheets

(56) References Cited

OTHER PUBLICATIONS

M. Keidar et al., "Increasing the Length of Single Wall Carbon Nanotubes in a Magnetically Enhanced Arc Discharge," Applied Physics Letters, 92, 043129, 2008; 3 pages.
I. Levchenko et al., "The Large Scale Production of Graphene Flakes Using Magnetically-Enhanced Arc Discharge between Carbon Electrodes," Carbon, vol. 48, issue 15, 2010, pp. 4570-4574.
"CheapTubes.com is the Source for Carbon Nanotubes & Graphene", CheapTubes.com; 2 pages, © 2005-2009.
O. Volotskova, et al., "Single-step Synthesis and Magnetic Separation of Graphene and Carbon Nanotubes in Arc Discharge Plasmas", The Royal Society of Chemistry; www.rsc.org/nanoscale, 2010, 5 pages.
J. Li, et al., "Correlation Between Formation of the Plasma Jet and Synthesis of Graphene in Arc Discharge", IEEE Transactions on Plasma Science, vol. 39, No. 11, Nov. 2011; pp. 2366-2367.
M. Keidar, et al., "Arc Plasma Synthesis of Carbon Nanostructures: Where is the Frontier?", Journal of Physics D: Applied Physics, 44 (2011) 174006; 7 pages.
X. Fang, et al., "Role of Substrate Temperature at Graphene Synthesis in an Arc Discharge", Journal of Applied Physics, 118; 103304 (2015); 7 pages.
A. Shashurin, et al., "Synthesis of 2D Materials in Arc Plasmas", Journal of Physics D: Applied Physics, 48, (2015); 314007; 10 pages.

\* cited by examiner

SYSTEM AND METHOD FOR MASS PRODUCTION OF GRAPHENE PLATELETS IN ARC PLASMA

RELATED APPLICATIONS

The present application is a continuation-in-part of U.S. application Ser. No. 13/910,699, filed Jun. 5, 2013, which claims priority to provisional application No. 61/658,665. The entire contents of those applications are hereby incorporated by reference. The present application also incorporates by reference the article Simultaneous Synthesis of Single-Walled Carbon Nanotubes and Graphene in a Magnetically-Enhanced Arc Plasma, Journal of Visualized Experiments, www.jove.com, February 2012, 60, e3455, 6 pages.

GOVERNMENT LICENSE RIGHTS

This invention was made with Government support under NSF Grant Nos. CBET-0853777. STTR-1010133 and DOE Grant No. DE-SC0001169 awarded by the National Science Foundation and Department of Energy, respectively. The Government has certain rights in this invention.

BACKGROUND OF THE INVENTION

Field of the Invention

The present invention relates to a system for producing graphene. More particularly, the present invention relates to a system for producing graphene in bulk quantities and low cost.

Background of the Related Art

Graphene is a one or a few atoms thick planar sheet of sp2-bonded carbon atoms that are densely packed in a honeycomb crystal lattice. A variety of outstanding graphene characteristics—such as high-carrier mobility, superior mechanical properties, extremely high surface area and thermal conductivity—leads to its potential application in carbon-based flexible and stretchable electronics, high-frequency transistors and magneto-electronic devices. However, before graphene material can be applied to commercial applications, it is necessary to find lower cost methods of mass production of high quality graphene platelets. This invention presents a plasma-based approach for mass production of high quality graphene platelets at low cost.

SUMMARY OF THE INVENTION

Accordingly, it is an object of the invention to provide a system and method for producing graphene. It is another object of the invention to provide a system and method for producing graphene at low cost, high volumes, and/or suitable for commercial applications. It is a further object of the invention to provide a system and method for producing graphene having a uniform size.

In accordance with these and other objects of the invention, the present invention is a system and method for producing graphene. The system includes a heating block configured to provide heat. A substrate is arranged about the heating block and is configured to receive heat from the heating block. A motor is connected to the substrate to rotate the substrate about the heating block. A cathode and anode are configured to direct a flux stream for deposit onto the rotating substrate. A collection device removes the deposited material from the rotating substrate. A heating element is embedded in the heating block and imparts heat to the heating block. The heating block is made of cement or other material that uniformly disperses the heat from the heating element throughout the heating block. The flux stream can be a carbon vapor, with the deposited flux being graphene.

These and other objects of the invention, as well as many of the intended advantages thereof, will become more readily apparent when reference is made to the following description, taken in conjunction with the accompanying drawings.

DETAILED DESCRIPTION OF THE PREFERRED EMBODIMENTS

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Figure 1:
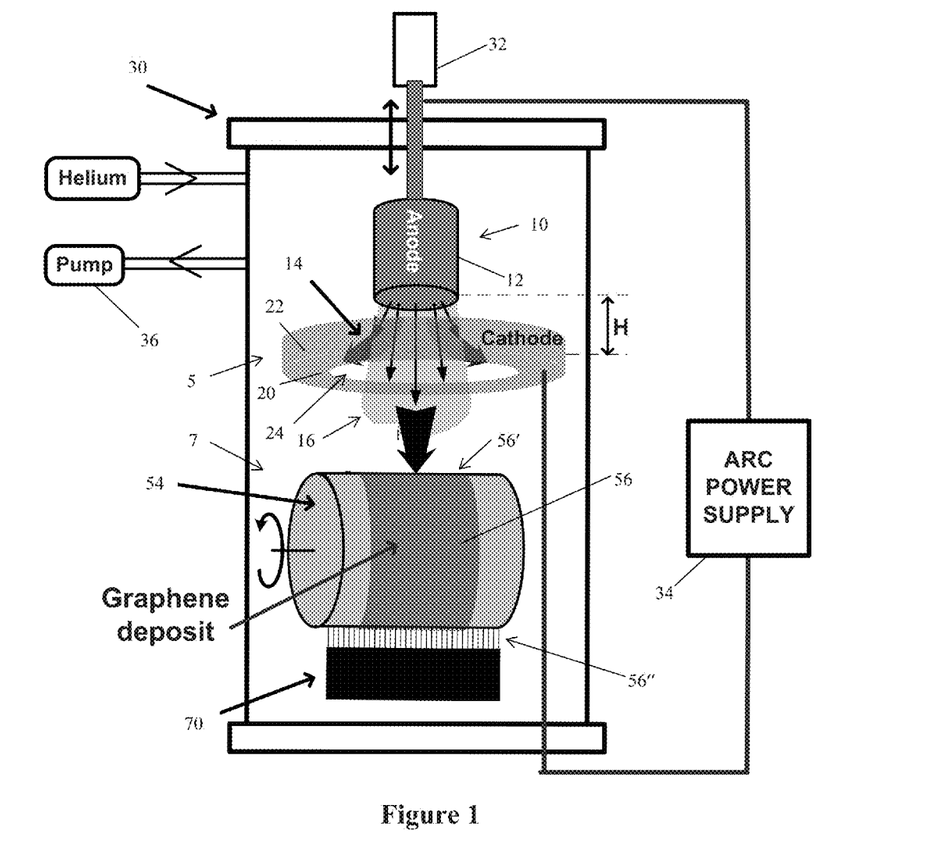
FIG. 1 shows the geometry of discharge electrodes in accordance with the invention.
Figure 2:
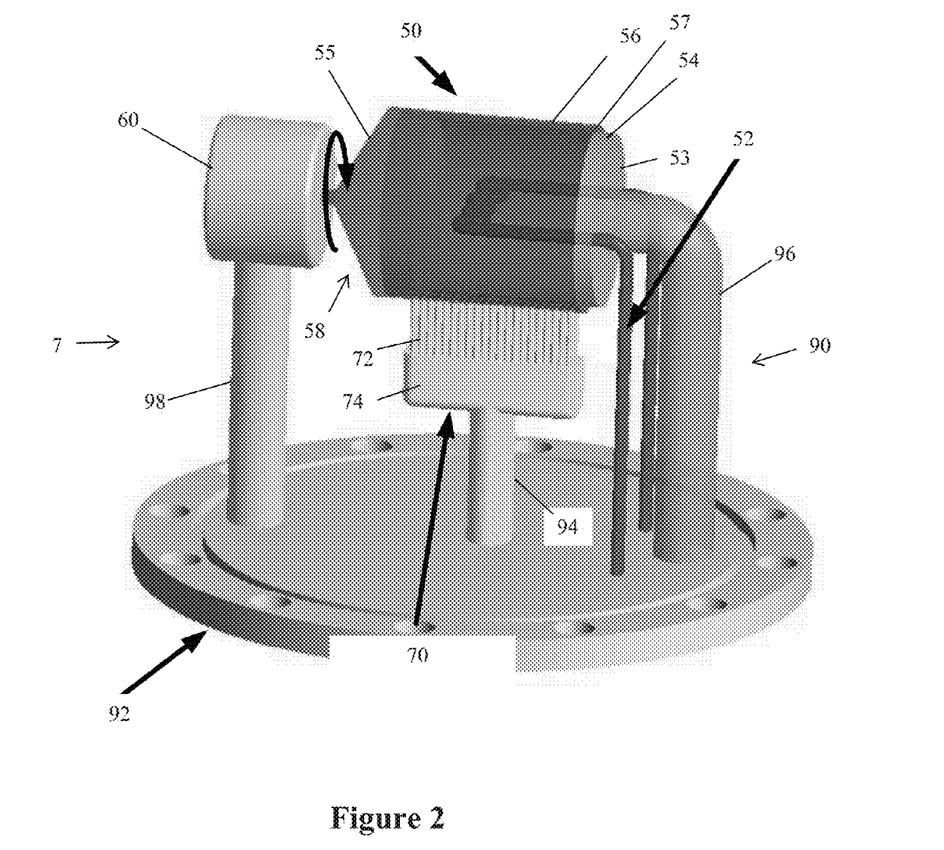
FIG. 2 shows schematics of movable rotating substrate assembly.
Figure 4:
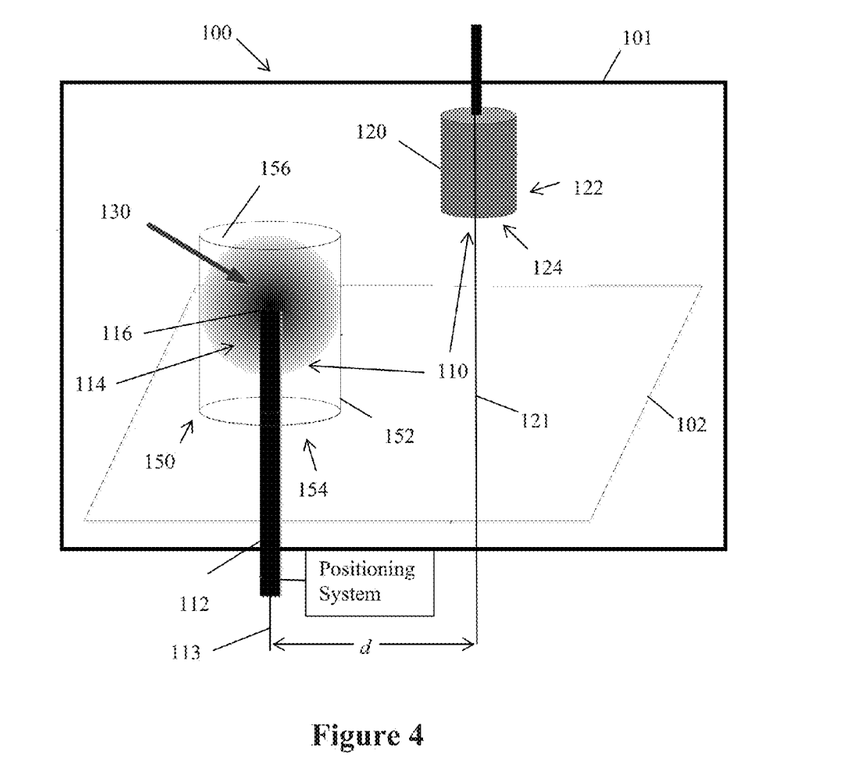
FIG. 4 is a view of another embodiment of the invention in which the anode and cathode are offset from one another.
Figure 5:
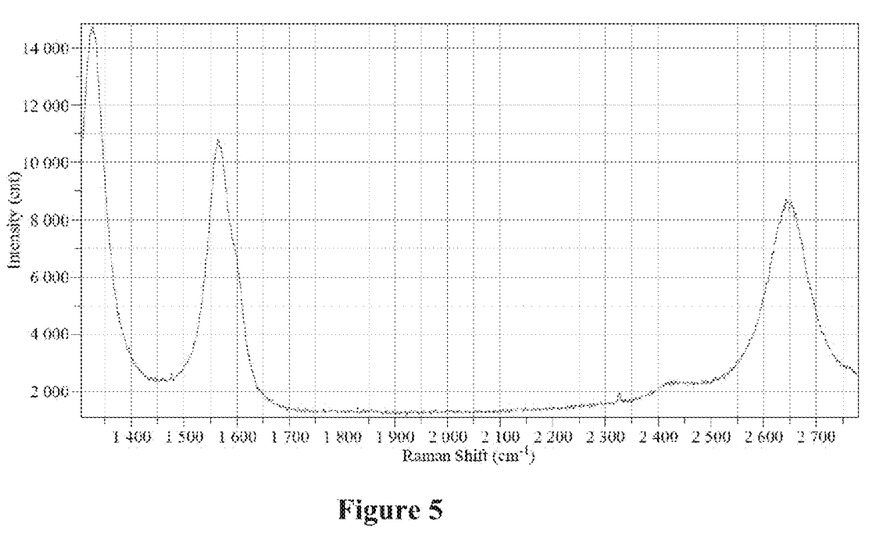
FIG. 5 is a Raman spectra for the bulk graphene produced from the embodiment of FIG. 4.

The present invention provides a system having a plasma-based approach for mass production of high quality graphene platelets at low cost. In the embodiment of FIGS. 1-3, the system 3 has an arc discharge assembly 5 with an anode 10 that is in alignment with a cathode 20. In the embodiment of FIGS. 4-5, the arc discharge assembly 110 has an anode 112 that is offset from the cathode 120.

Aligned Graphene Platelet System 3 (FIGS. 1-3)

Referring to FIG. 1, the graphene platelet system 3 has an arc discharge assembly 5 and a substrate assembly 7, as shown in FIG. 1. The arc discharge assembly 5 produces an arc discharge that is directed onto a substrate of the substrate assembly 7.

In accordance with the invention, a closed chamber 30 is provided for conducting synthesis, and encloses the arc discharge assembly 5 as well as the substrate assembly 7, as shown. Prior to synthesis, the chamber 30 is pumped down using a pump 36, to the pressures of at least $10^{-1}$-$10^{-2}$ Torr, e.g. by the mechanical rotary pump as shown in FIG. 1, and then filled in by helium with a purity of 99.995% to the pressure of 500 Torr. Synthesis can be also conducted in range of pressures of about several hundred Torr. Other background gases can be also used such as nitrogen, air etc. Background gas and its pressure provides the discharge mode required for the graphene synthesis to occur, and creates conditions on the substrate favorable for the synthesis. In yet another illustrative but non-limiting embodiment, the chamber 30 can be pumped down to a pressure of p<several hundred Torr (about 0-700 Torr), and more particularly $10^{-1}$ Torr, without filling the chamber 30 with any gas (other than ambient air). Filling the chamber 30 with Helium gas reduces the percentage of carbon flux reaching the sample due to convection around the heated sample, and reduces production yield.

The arc discharge assembly 5 includes an anode 10, cathode 20, and positioning system 32. Thus, the chamber 30 is equipped with a pair of discharge electrodes, namely the anode 10 and the cathode 20, which are shown in FIG. 1. The anode material is consumed during the synthesis, i.e. the anode length decreases during the arc discharge, while the anode diameter remains constant. The electrodes 10, 20 are separated from each other by the discharge gap H. The preferred size of the arc discharge gap H is from zero up to about 10 centimeters. The specific value of gap H is determined to minimize losses of the ablated material on the cathode surface while providing stable operation of the discharge.

As shown, the anode 10 has a cylindrical shape and is made of a pure graphite rod 12 with a diameter $OD_a$. The anode rod 12 is attached to a positioning system 32 as shown in FIG. 1, which feeds the anode rod 12 as it is consumed by the discharge in order to keep the same distance H to the cathode 20. It is noted than any suitable positioning system 32 can be provided that can feed the anode 10 as it consumed during the synthesis. The positioning system 32 can be located outside the chamber 30 with a support rod entering into the chamber 30 through an opening in a top plate of the chamber 30. The support rod is coupled with the anode 10. The diameter of the anode 10 $OD_a$ can be up to few centimeters if the arc discharge current $I_{arc}$ is correspondingly increased to several hundred amperes. As non-limiting examples of the invention, for an anode diameter of 1/16 inches, the preferred current is about 50 A; while if the anode diameter is about 2 cm the current should be increased to several hundred Amperes (up to 500-600 A).

The cathode 20 can be made of graphite or metal and can have a different geometry such as a ring 22, as shown, or other suitable shape such as a plate with a through hole or a torus. The ring 22 has an inner diameter $ID_c$ that defines a central opening or through-hole 24. The inner diameter $ID_c$ of the cathode 20 is larger than the outer diameter $OD_a$ of the anode rod 12, so that the anode rod 12 (and/or the flux) can go through the center opening 24 of the cathode 20.

As further shown, the electrodes 10, 20 are connected to an arc power supply 34. Any suitable power supply 34 can be utilized. The power supply 34 provides a continuous direct current in the range from about 10 A to about 600 A, and voltages up to 40-70 Volts. The power supply 34 is located outside the chamber 30 and is connected to the cathode 20 through an opening in a bottom plate (as shown) or a side wall of the chamber 30.

The schematics of the substrate assembly 7 are best shown in FIG. 2. It includes a hot metal substrate assembly 50, a graphene removing system 70 for removing the synthesized graphene product immediately after its synthesis, and a support assembly 90. The hot metal substrate assembly 50 includes a heating element 52, a cylindrical block 54, and a substrate 56. The heating element 52 is shown as a nickel-chromium resistant wire. The cylindrical block 54 is a solid block of high temperature cement that has a proximal end 53 facing in one direction and an opposite distal end 55 facing in an opposite direction. The heating element 52 is embedded in the cylindrical block 54. It forms a loop that enters and exits the proximal end 53 of the block 54. The portion of the heating element 52 that extends inside the heating block 54 has a general U-shape defined by two legs and a sinusoidal-shaped cross-member. The two legs extend to outside of the block 54.

The heating element 52 can be, for instance, a solid wire that is heated by electrical power. The heating element 52 is configured to heat the cement block 54, and the cement uniformly disburses the heat throughout the block 54 and uniformly heats the substrate 56. The purpose of the heating element 52 is to heat the substrate 56 to temperatures required for synthesis in the range 700-1,200° C., and more specifically 700-800° C. However, other suitable temperatures can be utilized that enable graphene synthesis with desired properties, such as 500-700° C. The lower temperatures of 500-700° C. provide quality graphene, but reduce the need to have a substrate 56 and/or substrate assembly 7 that can withstand higher temperatures.

The heating element 52 can be powered by the separate power supply or by same electrical current supporting the arc discharge supplied by the power supply 34. Of course, the heating element 52 can be configured in other ways, such as entering and/or exiting through the distal end 55 of the block 54, or extending in a circular pattern concentric with the block 54. Still yet, other suitable ways to heat the substrate 56 can be utilized such as heating by laser, by electron beam or the substrate can be heated in a self-consistent manner (i.e., no additional power is needed to heat the sample; instead, heat produced by the discharge is used to heat the substrate 56) by the hot carbonaceous vapor ablated from the anode or another way. Thus, a separate heating block 54 need not be used, and the substrate 56 can be directly heated. The distance from the anode 12 to the substrate 56 is controlled so that the temperature on the substrate 56 is within the ideal temperature ranges, such as 700-800° C.

The substrate 56 for the graphene growth is a copper cylinder that surrounds the cement cylindrical block 54. The substrate 56 has a hollow cylindrical shape with an open distal end 57 that defines a center inside space, and a conical shape top at the proximal end 58. The open distal end 57 receives the cylindrical block 54 in the interior space of the cylindrical substrate 56. Thus, the cylindrical substrate 56 is coaxially formed with the cylindrical block 54, with the block being concentrically arranged with respect to and inside of the substrate 56 and the substrate substantially surrounding the block. The cylindrical cement heating block 54 is not fully received (though can be) within the inner space of the substrate 56, so that the distal end 55 of the heating block 54 does not reach the proximal conical end 58 of the substrate 56. The proximal end 53 of the heating block 54 can be flush with (or protrude or recede from) the distal end of the substrate 56.

The substrate 56 and the heating block 54 are each elongated and have a central longitudinal axis. The substrate 56 and the heating block 54 lie on their sides, such that the longitudinal axes of the substrate 56 and the heating block 54 are substantially horizontal, as shown. Referring back momentarily to FIG. 1, the anode rod 12 is arranged with its longitudinal axis extending substantially vertical so that the end of the anode 12 is substantially horizontal and facing the cathode ring 22. The cathode ring 22 is arranged in a plane that is substantially horizontal and perpendicular to the longitudinal axis of the anode rod 12 and the forward-facing end of the anode 12. Accordingly in this configuration, the anode 10 is aligned with the cathode 20 (with the anode 10 directed toward the center of the cathode ring 22) so that the flux 16 is discharged downward from the anode rod 12, through the through-hole 24, and onto the top portion 56' of the substrate 56. However, the present invention is not limited solely to this configuration, and for instance the flux 16 can be directed upward or to the side. Changing of this configuration may result in a change of relative position of the graphene collection system since synthesized graphene falls from the substrate in the direction of gravitational force.

Returning to FIG. 2, the cylindrical substrate 56 has an inner diameter that is greater than the outer diameter of the cylindrical block 54, so that there is a space between the substrate 56 and the block 54. The gap should be small, about 1-2 mm, in order to maximize efficiency of heat transfer from the heating block 54 to the substrate and reduce losses of heat. The preferable diameter of the heating block 54 is in the range of about 1-20 cm, while preferable length of the heating block 54 is about 1-40 cm. The size of the heating block 54 should be larger for larger anode diameter, so that the block 54 and substrate 56 have a size suitable to substantially receive all of the flux 16 that is discharged from the anode 10. The substrate 56 is preferably larger than the dimensions of the flux 16 that is discharged. The substrate 56 is independent of the heating block 54, and the distal end 55 of the substrate 56 is connected to a motor 60 so that the substrate 56 can be rotated by the motor 60, as shown in FIG. 2. Thus, the substrate 56 rotates about the heating block 54, which remains fixed 54.

The substrate 56 is rigid with a preferable thickness in the range of about 1-2 mm. The substrate 56 should be rigid enough to be able to prevent folding or bending of the substrate and touching the heating block 54 when the brush 70 applies pressure to the substrate 56. The brush 70 can exert sufficient pressure to remove the graphene without damaging or moving the substrate 56. A support can also be provided at the distal end of the substrate 56, if needed. The heating block 54 uniformly heats the substrate 56. The substrate 56 is designed to operate at surface temperatures of up to 1000-1100° C. in free radiating conditions. The temperature of the substrate 56 at the synthesis should be in the range 700-1200° C., and preferably 700-800°, or lower temperatures of 500-700° C., as noted above. Different metals with low solubility for carbon can be used as a material for the substrate 56 such as molybdenum, copper, etc. However, other substrate 56 materials can be utilized, such as any material that can withstand temperatures of synthesis of about 500-800° C., including copper foil, Molybdenum sheets, Nicrome wire, Silicon wafer, $SiO_2$ thermal oxide wafer, ceramics etc. The substrate 56 can be wrapped round the block 54.

As shown, the adjustable brush 70 is provided at the bottom portion of the substrate 56. The brush 70 has a general T-shape formed by the vertical support arm 94 and the head. The head includes bristles 72 and across-support 74 that holds the bristles 72 in place. In one preferred illustrative non-limiting embodiment, the bristles 72 in the brush are made of brass that is soft enough to prevent scratching the substrate 56, but yet sturdy enough to remove the graphene from the substrate 56. For example, in preferable embodiment 0.1 mm diameter brass bristles are used. The bristles 72 of the brush 70 come into direct physical contact with the bottommost side of the rotating substrate 56 for removing the synthesized product from the substrate 56.

By having the brush 70 at the bottom of the substrate 56, the removed product can fall directly to the bottom of the chamber 30 unimpeded, or into a collection chamber positioned at the bottom of the chamber 30. In addition, the substrate 56 is positioned between the brush 70 (at the bottom portion of the substrate 56) and the flux 16 (at the top portion of the substrate 56) so that the brush 70 is not directly exposed to the flux 16 and the flux 16 does not adhere to the brush 70. The brush 70 can extend the entire length of the substrate 56, even if graphene is only deposited on a portion of the substrate 56, as shown in FIG. 1.

Referring to FIG. 2, a support assembly 90 is provided that supports the entire substrate assembly 7 and allows for convenient operation and adjustment of the substrate assembly 7. The support assembly 90 includes a base or flange 92 and support arm members 94, 96, 98. The base 92 can be a flat metal circular plate having a top planar surface. The support arm members 94, 96, 98 are elongated and extend upright from the top planar surface of the base 92. The support arm members 94, 96, 98 connect to the base 92 and each of the brush 70, concrete heating block 54, and motor 60 respectively, to hold those elements 70, 54, 60 in position with respect to one another and with respect to the base 92. The support arms 94, 96, 98 can each be separate elements that are connected to the respective brush 70, cement heating block 54 and motor 60. Or, the support arms 94, 96, 98 can be integrally formed with the respective brush 70, block 54 and motor 60. Still further, a single support arm can connect with two or all of the elements 70, 54, 60. In addition, the arms of the heating element 52 extend downward and through openings (which can include a seal) in the base plate 92, and exit through the bottom side of the base plate 92.

The substrate 56 preferably rotates at speeds of up to several thousand RPMs. Higher substrate speeds lead to the synthesis of thinner nanostructures. The preferred speed of substrate 56 rotation is in the range 100-10,000 RPM. This speed provides exposure time of the substrate 56 to the carbon flux in the range of about 3-300 ms which is preferable for the synthesis. Here, the exposure time refers to the time during which the substrate 56 is facing the discharge, i.e., exposed to the discharge, and is controlled by the rotational speed of the substrate 56. Alternative ways to remove the graphene can be shaking the substrate 50, compressed gas high velocity flow aimed at the substrate, ultrasound etc. The speed of rotation of the substrate 56 can be varied depending on the rate of flux that is generated. The flux strength can be controlled by the current.

Referring back to FIG. 1, the synthesis of graphene is shown. The synthesis occurs as a result of consumption of the anode material. An anodic arc discharge is utilized to provide consumption of the anode 12. The anodic arc discharge heats the anode 12 to the temperatures when it starts to sublimate. Sublimation of the anode 12 leads to creation of a flux containing of plasma-atomic mixture 16 of the carbon vapor and background gas having properties (temperature, composition, density, energies) important for the synthesis. Arc current flow path is indicated by curved arrows in FIG. 1.

The anodic arc discharge 14 is initiated inside the arc discharge gap H between the anode 12 and the cathode 20. It can be initiated by a mechanical touch of the anode 12 and the cathode 20 followed by their immediate separation. Or, it can be initiated by laser breakdown, mechanical trigger and the like. The magnitude of the electrical current of the arc discharge $I_{arc}$ is crucial for overall performance of system. Preferred magnitude of the electrical current of the arc discharge $I_{arc}$ is from about 10 A to about several hundred Amperes. The specific value of $I_{arc}$ will vary depending on the diameter of the anode 12. $I_{arc}$ increases for larger diameters of the anode 12.

As best shown in FIG. 1, the flux 16 of carbon vapor from the anode 12 is delivered to the rotating synthesis substrate assembly in the form of a plasma jet. In this configuration, graphene is being synthesized on a first side 56' (the top, as shown) of the substrate 56 that is exposed to the carbon vapor 16. The graphene forms on the surface of the substrate 56 immediately after the carbon flux reaches the first side 56'. The synthesis of graphene happens instantly at exposure to the carbon flux, so that the synthesis occurs much sooner than the period of revolution of the substrate 56 and is complete before it is to be removed by the brush 70. In one illustrative, non-limiting embodiment, the graphene formation time can be $10^{-3}$ seconds.

The graphene is then removed from the substrate 56 at a second side 56" by brushes of the removing system 70 after the substrate 56 rotates a one-half turn. As shown, the second side 56" of the substrate 56 is substantially opposite from the first side 56' of the substrate 56. The specific geometrical design of the substrate system can be different. The main purpose of this unit is to deliver maximum of the carbon flux to the hot substrate and minimize losses related with deposit of the carbon flux on the removing system and other surroundings and thus in turn to maximize efficiency of transfer of carbon flux to the form of graphene.

The graphene material that is removed from the substrate 56 is the final product of this invention. The graphene can be a one or few atom (can be up to several tens of layers) thick planar sheets of sp2-bonded carbon atoms having a honeycomb crystal lattice structure, though any suitable thickness for a desired application can be achieved. The graphene can be utilized for any commercial application, but is especially well-suited for electrodes for batteries or super capacitors, fuel cells or composite materials. Accordingly, the system and method of the invention provides mass production of graphene. Graphene platelets can be produced in bulk in tens of tons at low cost since graphene is synthesized directly from the raw carbon material without need to utilize any expensive chemicals.

In accordance with one non-limiting embodiment of the invention for purposes of illustration, synthesis can be performed using a cylindrical stainless-steel chamber 30 (254 mm length and 152 mm diameter), Initially the chamber 30 can be pumped down to the pressure less than $10^{-1}$ Torr vacuum and then filled in by helium with purity of 99.995%. The anode 12 is attached to a linear drive system, which keeps the predetermined gap distance according to the desired arc voltage after the discharge is initiated. An arc 14 is initiated between two cylindrical electrodes, the cathode 20 and the anode 12, using fuse wire or by mechanical touching of arc electrodes following by their immediate separation. The cathode 20 is a stainless steel ring with an inner diameter $ID_c=10$ mm, outer diameter $OD_c=25$ mm and height of 2 mm. The anode 12 is a pure carbon rod (POCO EDM-3) with a diameter of 1/16 inches. The synthesis is conducted at an arc current of 50 A, with an interelectrode gap distance H of about 1-2 mm, and a helium pressure of 500 Torr. These discharge parameters corresponded to arc voltage in the range 30-40 V. The temperature of the synthesis substrate 56 was 1,000° C. and its exposure time to the carbon flux is about 16-60 ms. A 25 μm thick copper foil substrate 56 with an area of about 1×1 cm$^2$ is used. The distance between the anode 10 and the substrate 56 is as small as possible to collect the entire flux from the cathode 20 and minimize losses of carbon material; but also large enough to prevent damage to the substrate 56 due to overheating by the discharge. In one preferred embodiment, the distance between the anode 10 and the substrate 56 is 0.5-10 centimeters.

Figure 3A:
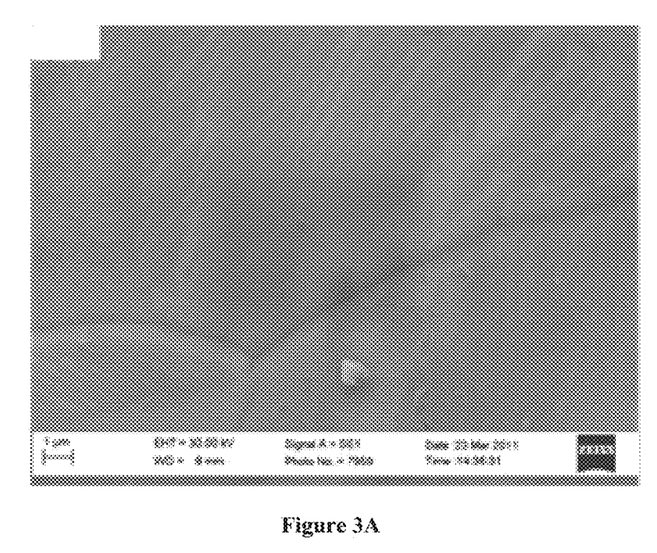
FIGS. 3(a)-(c) are SEM images of as grown graphene film on the copper foil and mechanically transferred to TEM grid.
Figure 3B:
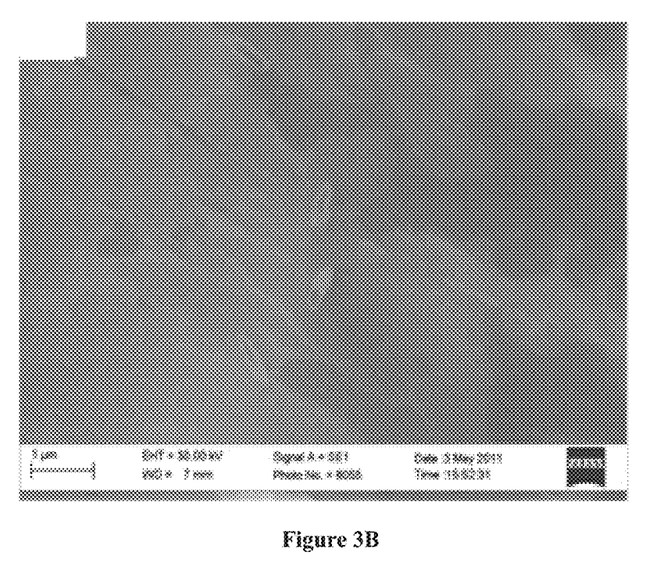
Figure 3C:
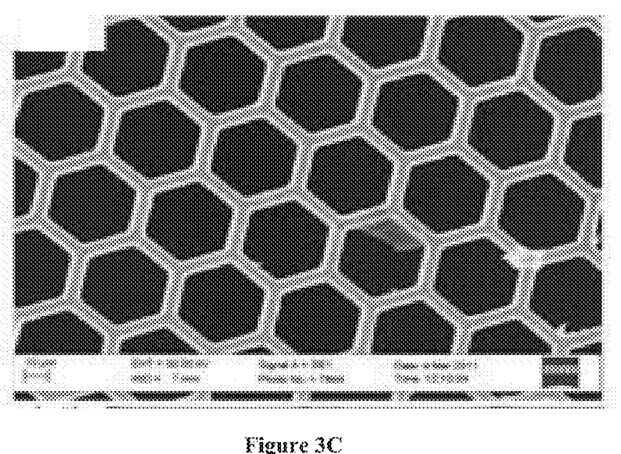
Figure 3D:
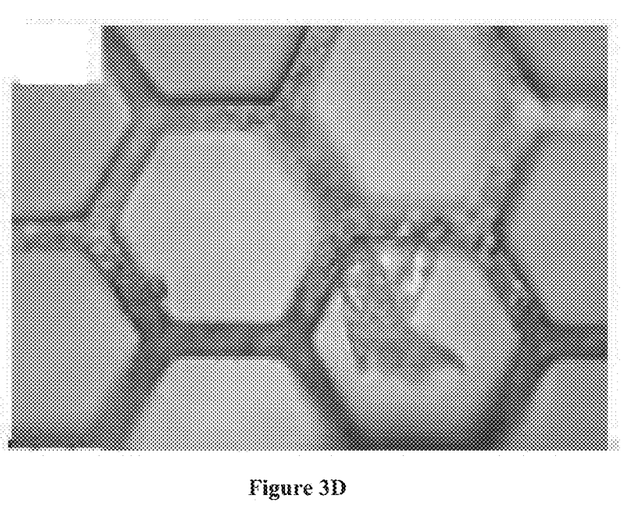
FIGS. 3(d)-(f) are optical microscope image and Raman spectra of synthesized graphene platelets.
Figure 3E:
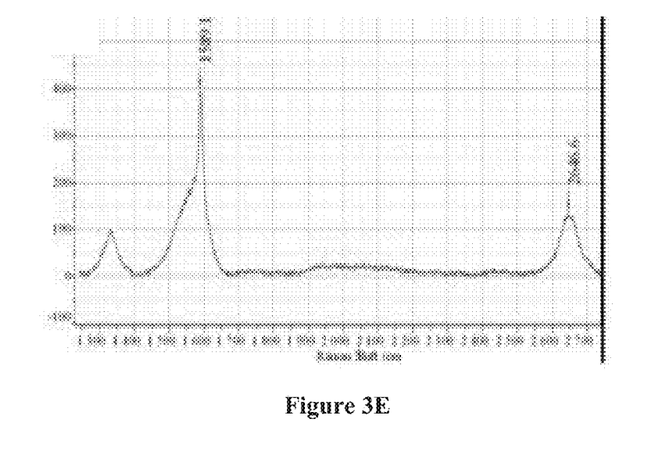
Figure 3F:
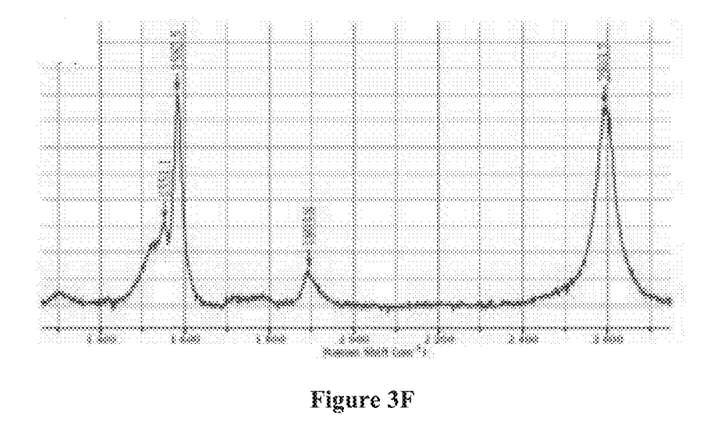
Figure 3G:
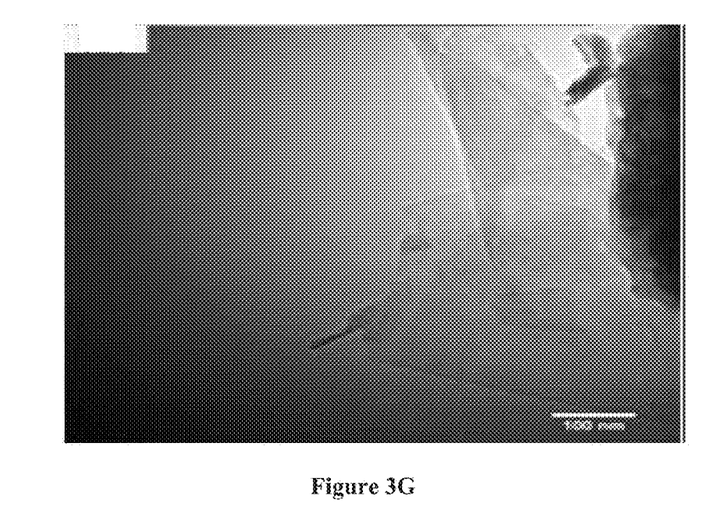
FIGS. 3(g), (h) are TEM image of graphene flake and electron diffraction pattern showing the crystalline structure of graphene.
Figure 3H:
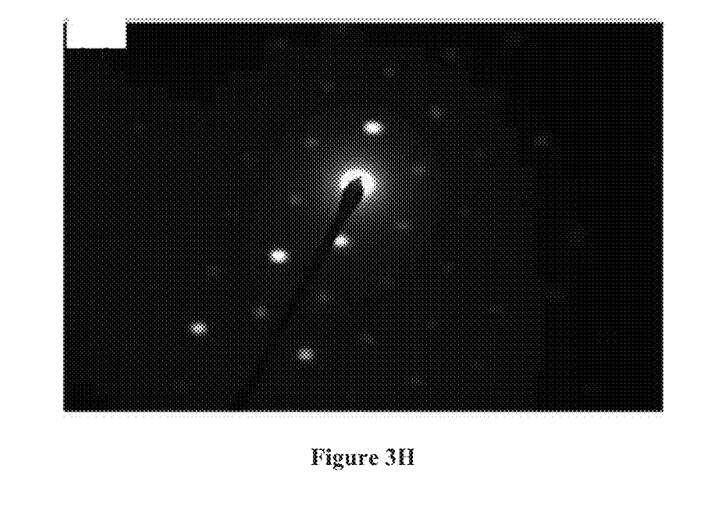

FIGS. 3a, 3b present SEM images of the copper foil substrate 56 with the graphene film grown on it after the arc run. SEM observations indicate the presence of graphene films covering almost the entire area of the Cu foil substrate with sizes of flakes being about several to tens of microns. By analyzing a large number of SEM images, amorphous carbon structures were observed on <5% of substrate area, which means that >95% of incoming carbon flux to the substrate was transferred to the form of graphene. The efficiency of transfer >95% allows the present system to provide graphene production at a rate of close to hundreds of mg per second (corresponding to tons of graphene per year per single arc setup) for high arc currents (about several hundred Amperes). The graphene films were then mechanically transferred to Cu mesh (by scratching the mesh over the substrate surface) and observed under Raman spectrometer. FIGS. 3c, 3d show microscope images of semi-transparent individual graphene flakes on the Cu mesh. The Raman spectra presented in FIGS. 3e, 3f indicates the presence of several layer graphene films on the substrate. The ratio of intensities of G to 2D peaks in the spectra was observed in the range of 1-3, which indicates that number of graphene layers was ≥2. The TEM images and electron diffraction pattern are presented in FIGS. 3g, 3h, showing the crystalline structure of synthesized thin (transparent) graphene platelets.

Offset Graphene Platelet System 100 (FIGS. 4-5)

Turning to FIG. 4, another illustrative and non-limiting embodiment of the invention is shown. A graphene platelet system 100 is provided having a discharge assembly 110 and a substrate assembly 150.

The discharge assembly 110 includes an anode 112 and a cathode 120. The anode 112 can be a solid elongated rod having a central longitudinal axis 113 and a distal end 114 with a tip 116. The cathode 120 can be a solid elongated cylinder with a central longitudinal axis 121 and a distal end 122. The cathode 120 has a diameter that is greater than the diameter of the anode rod 112. The anode 112 can be controlled by a positioning system that can be utilized to continuously feed the anode while it is being consumed during the synthesis keeping the same relative position of the anode 112 with respect to the cathode 102. The anode 112 and cathode 120 can be connected to the holding plate 102 to remain in a fixed position with respect to each other during operation.

A chamber 101 is provided that has the same purpose as the chamber 30 in the embodiment of FIGS. 1-3. The discharge assembly 110 and substrate assembly 150 are located within a chamber 101, so that the reaction between the anode 112 and cathode 120 can occur under pressure. The anode 112 and cathode 120 may extend outside of the chamber 101 for control and positioning.

The anode 112 and cathode 120 are positioned close enough to each other so that the anode 112 generates a plasma plume 130 from about the tip 116 and/or distal end 114, as described with respect to FIGS. 1-3. As shown, the central longitudinal axis 121 of the cathode 120 is substantially parallel to and offset from the central longitudinal axis 113 of the anode 112. Thus, the cathode longitudinal axis 121 and anode longitudinal axis 113 are offset from each other. In this embodiment, the cathode longitudinal axis 121 and anode longitudinal axis 113 are offset on a distance d. In one embodiment, that distance d can be several centimeters (such as up to about 6 cm), though other suitable distances can be utilized.

The substrate assembly 150 comprises a tube or cylinder 152 that is fitted about at least the distal end 114 of the anode rod 112. The cylinder 152 has a central bore 154 and two opposite ends that are open. The central bore 154 extends through the entire cylinder 152, from one end to the other, and forms an interior surface 156 on the wall of the cylinder 152. That interior surface 156 is the substrate upon which the plasma 130 is deposited. The cylinder in this embodiment is made of Molybdenum foil of 0.3 mm thickness, however thickness can vary. This cylinder is self-consistently heated by the discharge (no additional power source to heat it is used) as described above. The cylinder 152 can be connected to the holding plate 102 to remain at its position with respect to the anode 112 during operation.

As shown, the distal end 114 of the anode 112 extends into the central bore until the tip 116 is at about the middle of the cylinder 152. The cylinder 152 surrounds the tip 116. The distal end of the cylinder 152 is open, so that current can travel between the anode 112 and the cathode 120. When the anode 112 and cathode 120 are activated, a plasma 130 will emit from the tip 116 of the anode rod 112, as described with respect to FIGS. 1-4 above. The plasma 130 will then be directly deposited on the interior surface 156 of the cylinder 152. The tip 116 is placed at about the middle of the cylinder 152 because the plasma 130 emits in all directions (360°) from the anode tip 116. Thus, plasma 130 will deposit along the entire length of the interior surface 156.

The present embodiment avoids any of the flux 130 that is ablated from the anode 112 from being blocked or shadowed by the cathode 120 or any other element of the system 100 and maximizes the fraction of the material ablated from the anode 112 that reaches interior surface 156. In the embodiment of FIG. 1, some of the flux 16 can be deposited on the cathode ring 22. However, in the present embodiment of FIG. 4, the flux 130 is deposited directly on the interior surface 156 of the cylinder 152. The flux 130 almost entirely passes directly from the distal end 114 of the anode rod 112 to the interior surface 156 of the cylinder 152. In one embodiment, the pressure (p) and the inter-electrode gap distance d can be adjusted to fulfill the minimal voltage breakdown requirement corresponding to the minimum of the Paschen breakdown curve, which typically occurs at about p×d of about 1-5 Torr cm. Thus, as the pressure increases, the distance d can be decreased; and as the distance d increases, the pressure can be decreased. The Paschen breakdown voltage can be used since the pressure is reduced in the present embodiment. This allows the discharge electrodes to be separated to distances significantly exceeding their diameters, ensuring that shadowing effect introduced by the cathode 120 in the expanding from the anode 112 plasma flux 130 is minimal. Realistic distances between the cathode 120 and the anode 112 are in the range>several centimeters. Thus corresponding synthesis pressure is <1 Torr. If the anode 112 is too far from the cathode 120, there can be too much resistance. If the anode 112 is too close to the cathode 120, then the cathode 120 can potentially block or interfere with the flux 130.

Once the flux 130 is deposited on the interior surface 156 of the cylinder 152, it can be removed by a graphene removal system. For instance, a brush or brushes similar to the one shown in FIGS. 1-3 can be utilized. The brush(es) can continuously remove graphene. In one embodiment, the cylinder 152 can rotate, and the brush remains stationary and extend along the entire length of the surface 156 parallel to the longitudinal axis from one end to the other to remove graphene. Graphene can then fall out of the bottom (proximal end) opening of the cylinder 152 and be collected. Or, the cylinder 152 can rotate and/or go up and down with the brush remaining stationary, or the brush can go up and down as the cylinder 152 rotates. As with FIGS. 1-3, the brush can remove graphene simultaneous with the flux 130 being deposited on the substrate.

In one embodiment, the cathode 120 and anode 112 are both made of graphite and provide a carbon plasma plume 116. The anode 112 can be the Poco EDM-3 anode with a diameter of one-eighth (⅛) of an inch, and the cylinder is made of Molybdenum with a 25 mm internal diameter and a 45 mm height. The internal diameter should be chosen to achieve a desired heating of the cylinder in the range 70-800° C. as described above. If higher arc current is used, then a larger diameter of the cylinder should be used to prevent overheating of the internal surface 156. If a smaller arc current is used, then a smaller diameter of the cylinder should be used. In one embodiment, the current is 70 A and the internal diameter of the cylinder is 25 mm, so that the anode is about 25 mm from the internal surface 156. The central longitudinal axis 113 of the anode 112 can be at a distance d of about 5 cm from the central longitudinal axis 121 of the cathode 120. Self-consistent heating is utilized, where the cylinder 150 is heated only by the energy of the plasma plume 130 reaction between the cathode 120 and the anode 112, which is about 700° C. in the present embodiment, with a pressure of about 0.1 Torr. The graphene synthesis rate up to about 0.5 g/min. can be achieved with 90% efficiency of the electrode material utilization, though other distances, temperature, pressure, cylinder diameters can be provided for mass production applications and higher speeds can be achieved for mass production applications. In one embodiment, the invention provides a high current anodic arc, $I_{arc}$ of 100 Amperes, $U_{arc}$ of 30-50 Volts, and electrode material of Carbon.

FIG. 5 shows a Raman spectrograph of build graphene produced in a 35 second long arc at 70 A. As illustrated, the Raman spectrum indicates a presence of a pronounced 2D peak (at ~2700 cm$^{-1}$) having an intensity close to that of the G-peak (at ~1550 cm$^{-1}$), which indicates that an average number of layers is ~2. Note, a large D-peak (at ~1350 cm$^{-1}$) is caused by random orientation and small size of flat graphene areas (~tens of nm).

Figure 6:
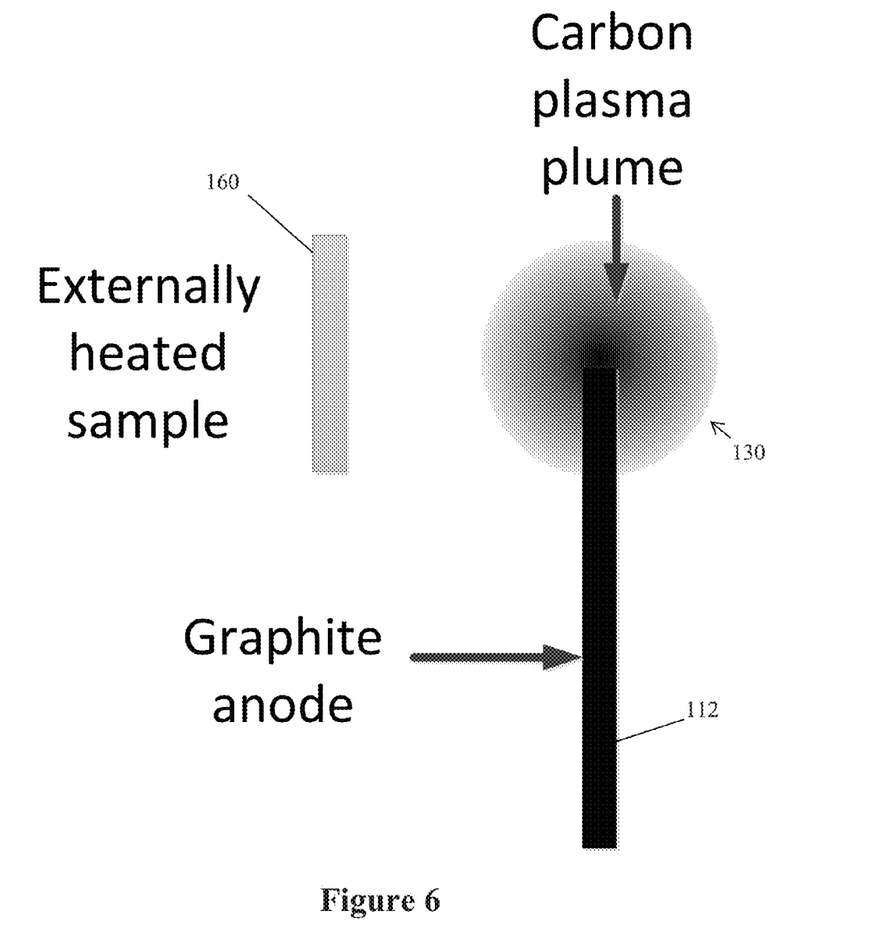
FIG. 6 is a view of a another embodiment of the invention having the anode and cathode offset from one another.

Another illustrative embodiment of the invention is shown in FIG. 6. Here, only the anode 112 is shown, and the cathode 120 can be positioned as in FIG. 4 above. A flat substrate 160 is provided instead of the cylinder 152 of FIG. 4. The substrate 160 can be a thin member with a surface that faces the plume 130 and is in a plane that is substantially parallel to the longitudinal axis 113 of the anode rod 112. The substrate 160 can be provided on a side of the anode 112 that is opposite that of the cathode 120. That is, the substrate 160 is not between the anode 112 and the cathode 120. The surface can be any suitable shape, such as rectangular, square or circular. The substrate 160 can be at a distance that collects plasma 130 and can be scraped with a brush or the like to remove graphene.

Figure 7:
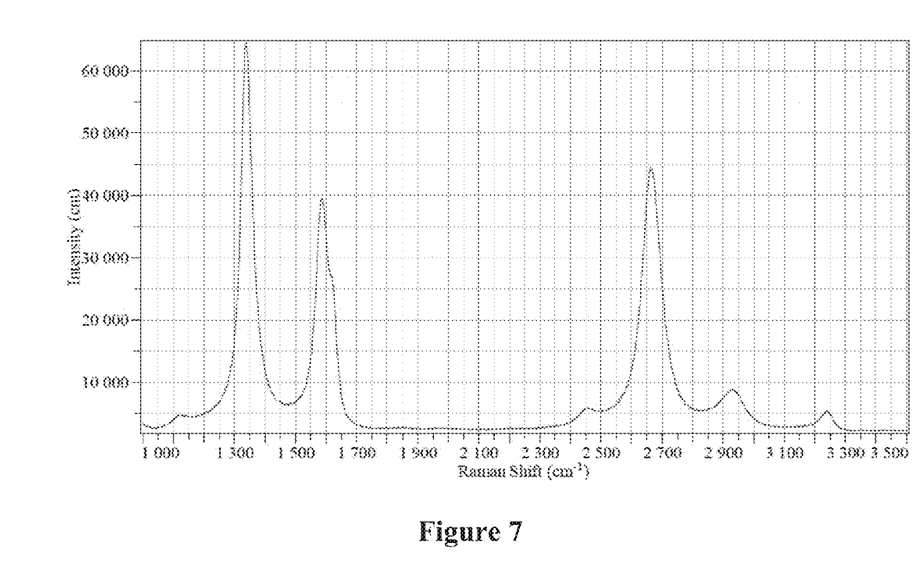
FIG. 7 is a Raman spectra for the bulk graphene produced from the embodiment of FIG. 6.
Figure 8:
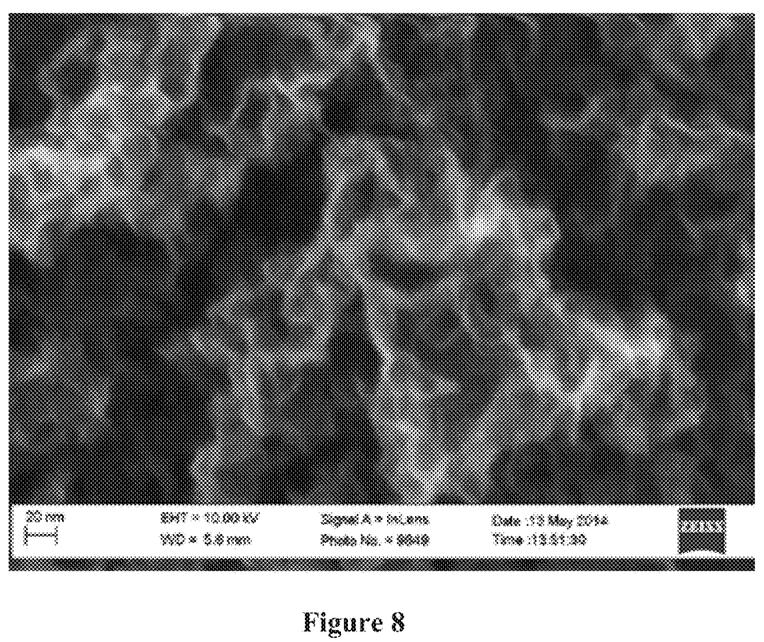
FIG. 8 is a SEM image of the graphene produced by the embodiment of FIGS. 4 and 6.

In one embodiment, the anode 112 can be a Poco EDM-3 anode with a diameter of one-eighth (⅛) of an inch. The substrate 160 can be, for instance, a Silicon wafer, a $SiO_2$ wafer, or a Nichrome wire, whereby the wafer(s) or the wire are heated directly by electric current flowing thru it. The distance from the anode 112 to the substrate 160 can be about 5 cm. The substrate 160 can be externally heated (not self-consistent heating), such as in the range of about 700-800° C. or the ranges used with respect to FIGS. 1-3 above. The Si wafer substrate 160 can be heated by the electric current flowing through it. However any other way to heat the substrate 160 can be utilized. Different film thicknesses can be achieved by varying the distance from the substrate 160 to the anode 112, and the synthesis time. FIG. 7 shows the Raman spectra results of the Si wafer sample heated to 750° C. from a 0.4 s long arc at 70 A. As shown, the Raman spectrum indicates the presence of a pronounced 2D peak (at ~2700 cm$^{-1}$) having an intensity close to that of the G-peak (at ~1550 cm$^{-1}$), which indicates that the average number of layers is ~2. The large D-peak (at ~1350 cm$^{-1}$) is caused by random orientation and small size of flat graphene areas (~tens of nm). FIG. 8 is a SEMS image of the thin graphene film that is produced. As shown, the graphene flakes are arranged in an entangled web-like structure.

The transition to the cathodic mode can be achieved by increasing the anode diameter while keeping the arc current unchanged. For instance, the anode 112 can be carbon having a 0.5 inch diameter and arc current about 70 A, and a graphene cathode 120 of one-eighth inch at a distance d of 1 cm at 0.1 Torr. This allows the ionization degree of the plasma flow to increase and causes higher reactivity of the carbon species. As a result, graphene can be synthesized at lower temperatures down to 500° C.

While the invention is discussed and shown with respect to FIGS. 4-7, it will be appreciated that the invention can be embodied in different ways. For instance, the anode 112 and cathode 120 need not be arranged vertically, but one or both can be arranged horizontally or at other positions with respect to each other. In addition to further retain plasma 130 emitted from the anode 112, the distal end of the cylinder 152 can be closed or partially closed by a removable cover or the like; and/or the proximal end of the cylinder 152 can be closed or partially closed about the anode rod 112. In addition, while the anode and cathode are shown to be elongated elements having longitudinal axes, they need not be elongated and need not have longitudinal axes, but instead can be other shapes or sizes and still be offset from one another whereby the anode and cathode are not aligned with each other in at least the x-direction.

Accordingly, the invention of FIGS. 1-7 product graphene, graphene platelets, and graphene films, with flakes in the nanometer range and high purity. Platelets can be utilized for instance for reinforced plastics, and electrochemical energy storage, and films can be utilized for electrochemical energy storage, and conductive transparent films for optics. The systems of the current invention can operate at reduced price and provide superior graphene properties from about 1-3 layers with high purity, and can be utilized for the mass production of bulk graphene (tens of tons).

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. For instance, while the invention is shown and described for the production of graphene platelets, it can be utilized to produce other materials and/or substances and in particular for synthesis of other 2D materials such as molybdenum disulfide $MoS_2$, boron nitride BN etc. Therefore, it is not desired to limit the invention to the specific examples disclosed or the exact construction and operation shown and described. Rather, all suitable modifications and equivalents may be resorted to, falling within the scope of the invention.

The invention claimed is:

1. A graphene producing arc discharge device comprising:
a chamber;
a graphite cathode comprising a graphite cathode electrode inside the chamber and forming a graphite cathode ring with a central opening, the graphite cathode ring lying in a cathode ring plane and having a first side and a second side opposite the first side;
an ablative carbon anode comprising a carbon anode electrode inside the chamber and forming a carbon anode rod with a longitudinal axis, the longitudinal axis substantially orthogonal to the cathode ring plane and the carbon anode rod aligned with the central opening of the graphite cathode at the first side of said graphite cathode;
a substrate inside the chamber and aligned with said graphite cathode and said ablative carbon anode at the second side of said graphite cathode, wherein said substrate is a cylindrical tube that extends along a longitudinal axis, the longitudinal axis being substantially perpendicular to a longitudinal axis of the carbon anode electrode, and the cylindrical tube being rotatable,
wherein said graphite cathode electrode and said carbon anode electrode are configured to create an arc discharge producing a carbon vapor flux stream from said carbon anode rod that extends through the central opening of the graphite cathode ring and directly deposits graphene material from the carbon vapor flux stream of said carbon anode rod onto an outer surface of the cylindrical tube as the cylindrical tube rotates; and
a collection device inside the chamber comprising a brush and configured to remove the graphene material that has been deposited onto the outer surface of the cylindrical tube.

2. The device of claim 1, further comprising a collection device configured to remove the deposited material from said substrate.

3. The device of claim 2, wherein said collection device comprises a brush.

4. The device of claim 1, wherein the collection device removing the graphene material from said substrate simultaneous with said ablative carbon anode depositing the graphene material on said substrate.

5. The device of claim 1, wherein said substrate is heated by the carbon vapor flux stream.

6. The device of claim 1, wherein said carbon anode a carbon anode electrode and said graphite cathode is a graphite cathode electrode, wherein said carbon anode electrode and graphite cathode electrode are configured to provide said flux stream.

7. The device of claim 1, wherein the device operates at a pressure of up to 500 Torr of helium and a substrate temperature of 700-1,200° C.

8. The device of claim 1, further comprising a heating block comprising a solid cylindrical heating block and wherein said substrate is coaxially arranged about said solid cylindrical heating block.

9. The device of claim 8, further comprising a heating element embedded in the heating block, said heating element imparting heat to said heating block, and said heating block dispersing the heat from said heating element uniformly throughout said heating block to uniformly heat said substrate.

10. The device of claim 9, wherein said substrate includes a conical top connected to a rotation device to rotate said heating block.

11. The device of claim 9, wherein said solid cylindrical heating block is concentrically arranged inside said cylindrical tube whereby an inside diameter of said cylindrical tube is greater than an outer diameter of said solid cylindrical heating block.

12. The device of claim 8, wherein said heating block comprises cement.

13. The device of claim 8, wherein said cylindrical tube has at least one open end, and said heating block is received in the open end of said substrate.

14. The device of claim 1, further comprising a collection device configured to remove the deposited material from said substrate, said collection device comprising a brush.

15. The device of claim 1, further comprising a rotation device configured to rotate said substrate, and wherein said carbon vapor flux stream is deposited on said substrate at a first side of said substrate simultaneously with said collection device removing the graphene material from a second side of said substrate as the substrate rotates, wherein said first side is different from said second side.

16. The device of claim 15, wherein the first side comprises a top portion of said substrate and the second side comprises a bottom portion of said substrate.

17. The device of claim 1, wherein the longitudinal axis of said ablative carbon anode is substantially vertical whereby the carbon vapor flux stream projects substantially outward and downward from a distal end of said ablative carbon anode.

* * * * *